(12) United States Patent
Shin et al.

(10) Patent No.: US 10,793,436 B2
(45) Date of Patent: Oct. 6, 2020

(54) TWO-DIMENSIONAL TRANSITION METAL CHALCOGENIDE NANOSTRUCTURE, DEVICE INCLUDING THE SAME, AND METHOD OF PREPARING THE TWO-DIMENSIONAL TRANSITION METAL CHALCOGENIDE NANOSTRUCTURE

(71) Applicants: Samsung Electronics Co., Ltd., Suwon-si, Gyeonggi-do (KR); Research & Business Foundation Sungkyunkwan University, Suwon-si, Gyeonggi-do (KR)

(72) Inventors: Hyeonjin Shin, Suwon-si (KR); Meeree Kim, Suwon-si (KR); Hyoyoung Lee, Suwon-si (KR); Yunhee Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/805,810

(22) Filed: Nov. 7, 2017

(65) Prior Publication Data

US 2018/0148334 A1 May 31, 2018

(30) Foreign Application Priority Data

Nov. 25, 2016 (KR) .................. 10-2016-0158495

(51) Int. Cl.
| | | |
|---|---|---|
| *C30B 29/46* | (2006.01) | |
| *C30B 29/60* | (2006.01) | |
| *C30B 7/14* | (2006.01) | |
| *C01B 19/00* | (2006.01) | |
| *B82Y 30/00* | (2011.01) | |
| *B82Y 40/00* | (2011.01) | |
| *B82Y 10/00* | (2011.01) | |
| *H01L 29/06* | (2006.01) | |

(52) U.S. Cl.
CPC ............ *C01B 19/007* (2013.01); *B82Y 10/00* (2013.01); *B82Y 30/00* (2013.01); *B82Y 40/00* (2013.01); *C30B 7/14* (2013.01); *C30B 29/46* (2013.01); *C30B 29/60* (2013.01); *C01P 2002/74* (2013.01); *C01P 2004/04* (2013.01); *C01P 2004/20* (2013.01); *H01L 29/0665* (2013.01); *Y10S 977/755* (2013.01); *Y10S 977/825* (2013.01); *Y10S 977/896* (2013.01); *Y10S 977/932* (2013.01)

(58) Field of Classification Search
None
See application file for complete search history.

(56) References Cited

U.S. PATENT DOCUMENTS

| | | | |
|---|---|---|---|
| 2013/0112110 A1* | 5/2013 | Stevenson | B05D 7/24 106/287.19 |
| 2015/0266735 A1* | 9/2015 | Hernandez-Sanchez | C01B 19/007 423/509 |
| 2016/0035568 A1 | 2/2016 | Chung et al. | |

FOREIGN PATENT DOCUMENTS

| | | |
|---|---|---|
| KR | 10-1046072 B1 | 7/2011 |
| KR | 10-1273797 B1 | 6/2013 |
| KR | 10-1591240 B1 | 2/2016 |

OTHER PUBLICATIONS

Y. Guo et al, "Shape-Programmed Nanofabrication: Understanding the Reactivity of Dichalcogenide Precursors" ACS Nano, 2013, 7, 3616.

* cited by examiner

*Primary Examiner* — Sheng H Davis
(74) *Attorney, Agent, or Firm* — Harness, Dickey & Pierce, P.L.C.

(57) ABSTRACT

Example embodiments relate to a method of preparing a two-dimensional (2D) transition metal chalcogenide nanostructure, the method including preparing a 2D transition metal chalcogenide nanostructure by a reaction between a transition metal precursor and a chalcogen precursor in a composition including a solvent, wherein the chalcogen precursor is a compound including a first bond connecting two neighboring chalcogen elements and the second bond connecting one of the two neighboring chalcogen elements and a hetero-element adjacent thereto, and binding energy of the second bond is 110% or less of the binding energy of the first bond, a 2D transition metal chalcogenide nanostructure prepared thereby, and a device including the 2D transition metal chalcogenide nanostructure.

5 Claims, 15 Drawing Sheets

TWO-DIMENSIONAL TRANSITION METAL CHALCOGENIDE NANOSTRUCTURE, DEVICE INCLUDING THE SAME, AND METHOD OF PREPARING THE TWO-DIMENSIONAL TRANSITION METAL CHALCOGENIDE NANOSTRUCTURE

CROSS-REFERENCE TO RELATED APPLICATION

This application claims the benefit of priority from Korean Patent Application No. 10-2016-0158495, filed on Nov. 25, 2016, in the Korean Intellectual Property Office, the disclosure of which is incorporated herein in its entirety by reference.

BACKGROUND

1. Field

Example embodiments relate to a two-dimensional (2D) transition metal chalcogenide nanostructure, a device including the same, and/or a method of preparing the 2D transition metal chalcogenide nanostructure.

2. Description of the Related Art

A two-dimensional (2D) transition metal chalcogenide (TMC) nanostructure has been observed to have unique properties of a metal or a semiconductor, unlike a TMC in a bulk configuration. For example, a 2D TMC in a bulk configuration has physiochemical properties, such as conduction, absorption, and quantum efficiency, that are significantly influenced by the number of layers therein, and has an indirect electron band structure, whereas a typical 2D TMC nanostructure typically has a direct electron band structure. In this regard, 2D TMC nanostructure may be used as a material for electronic devices, photocatalysts, and solar cells.

The 2D TMC nanostructure may be prepared by chemical vapor deposition (CVD) and physical exfoliation methods, but mass production thereof using these methods typical presents challenges.

Solution phase synthesis is a simple process that enables mass production. However, such a synthesis method is typically not suitable to control the structure of the 2D TMC nanostructure.

Therefore, a synthesis method capable of more easily controlling the structure of the 2D TMC nanostructure may be advantageous.

SUMMARY

Example embodiments relate to a method of preparing a two-dimensional (2D) transition metal chalcogenide nanostructure.

Example embodiments relate to a 2D transition metal chalcogenide nanostructure.

Example embodiments relate to a device including the 2D transition metal chalcogenide nanostructure.

Additional example embodiments will be set forth in part in the description which follows and, in part, will be apparent from the description, or may be learned by practice of the example embodiments.

According to an example embodiment, a method of preparing a 2D transition metal chalcogenide nanostructure, the method includes:

preparing a 2D transition metal chalcogenide nanostructure by a reaction between a transition metal precursor and a chalcogen precursor in a composition including a solvent, wherein the chalcogen precursor is a compound including a first bond connecting two neighboring chalcogen elements and a second bond connecting one of the two neighboring chalcogen elements and a hetero-element adjacent thereto, and a binding energy of the second bond is about 110% or less of the binding energy of the first bond.

According to an example embodiment a 2D transition metal chalcogenide nanostructure includes:

a transition metal chalcogenide (TMC) represented by Formula 7, after performing a rapid thermal annealing (RTA) process on the TMC represented by Formula 7, a peak corresponding to 4f orbital of metal M of the TMC represented by Formula 7 is shifted to a direction of increasing a binding energy thereof in an X-ray photoelectron spectroscopy (XPS) spectrum, wherein the peak is shifted by 1 electron volts (eV) or less:

$$M_b Y_c. \qquad \text{<Formula 7>}$$

In Formula 7, M is zirconium (Zr), titanium (Ti), hafnium (Hf), vanadium (V), niobium (Nb), tantalum (Ta), molybdenum (Mo), tungsten (W), technetium (Tc), rhenium (Re), cobalt (Co), rhodium (Rh), iridium (Ir), nickel (Ni), palladium (Pd), or platinum (Pt), Y is sulfur (S), selenium (Se), or tellurium (Te), and b is 1 or 2, and c is an integer of 1 to 3.

According to an example embodiment, a device includes the 2D transition metal chalcogenide nanostructure.

BRIEF DESCRIPTION OF THE DRAWINGS

These and/or other example embodiments will become apparent and more readily appreciated from the following description of the example embodiments, taken in conjunction with the accompanying drawings in which.

DETAILED DESCRIPTION

Figure 1A:
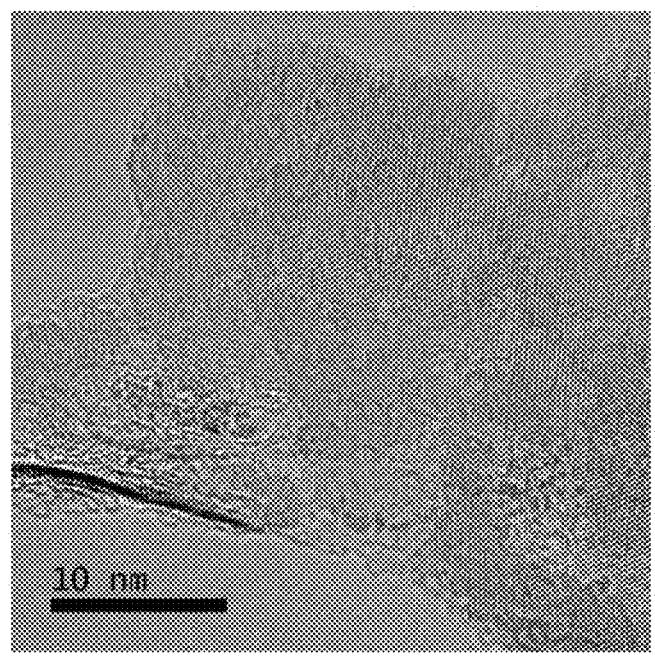
FIG. 1A is a transmission electron microscope (TEM) image showing a two-dimensional (2D) WSe$_2$ nanostructure prepared according to Example 1.

Reference will now be made in detail to example embodiments illustrated in the accompanying drawings, wherein like reference numerals refer to like elements throughout. In this regard, the example embodiments may have different forms and should not be construed as being limited to the descriptions set forth herein. Accordingly, the example embodiments are merely described below by referring to the figures. As used herein, the term "and/or" includes any and all combinations of one or more of the associated listed items. Expressions such as "at least one of," when preceding a list of elements, modify the entire list of elements and do not modify the individual elements of the list.

Hereinafter, a method of preparing a two-dimensional (2D) transition metal chalcogenide nanostructure, a 2D transition metal chalcogenide nanostructure, and a device including the same will be described in detail according to example embodiments.

The term "two-dimensional (2D) nanostructure" used herein may refer to a nanostructure whose size is substantially defined by a first dimension and a second dimension. In this regard, the two-dimensional (2D) nanostructure may refer to a nanostructure whose third dimension size is ⅕ or less of the size of the first dimension and the second dimension. For example, the first and second dimensions of the two-dimensional (2D) nanostructure respectively have a size in a range of 5 nm to 500 nm, and the third dimension of the two-dimensional (2D) nanostructure has a size less than 5 nm. For example, the first and second dimensions may correspond to x-axis and y-axis directions of the two-dimensional (2D) nanostructure, and the third dimension may correspond to an z-axis direction which is a thickness direction of the two-dimensional (2D) nanostructure.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

According to an example embodiment, a method of preparing a 2D transition metal chalcogenide nanostructure includes preparing a 2D transition metal chalcogenide nanostructure by a reaction between a transition metal precursor and a chalcogen precursor in a composition including a solvent, wherein the chalcogen precursor is a compound including a first bond connecting two neighboring chalcogen elements and a second bond connecting one of the two neighboring chalcogen elements and a hetero-element adjacent thereto, and a binding energy of the second bond is about 110% or less of the binding energy of the first bond. For example, when the first bond has a binding energy of about 100 kcal/mol, the second bond may have a binding energy greater than 0 and less than or equal to about 110 kcal/mol.

In the chalcogen precursor, by controlling the binding energy of the second bond, which is a bond connecting one of the two neighboring chalcogen elements and a hetero-element (e.g., a carbon atom), to less than or equal to about 110% of the binding energy of the first bond, which is a bond between the two neighboring chalcogen elements, a 2D transition metal chalcogenide nanostructure having a low content of impurities and high crystallinity and being capable of suppressing structural changes upon heat treatment may be prepared. That is, by controlling the structure of a chalcogen precursor compound such that the size of the second bond may be similar to the size of the first bond or the binding energy of the second bond may be smaller than the binding energy of the first bond, a 2D transition metal chalcogenide nanostructure having a low content of impurities by a liquid phase reaction and high crystallinity and being capable of suppressing structural changes upon heat treatment may be prepared.

For example, regarding the method of preparing the 2D transition metal chalcogenide nanostructure, the chalcogen precursor may be a compound represented by Formula 1:

R1-A1-A2-R2.    <Formula 1>

In Formula 1, A1 and A2 may each independently be a chalcogen element,

R1 and R2 may each independently be a C1-C5 alkyl group substituted or unsubstituted with a halogen, a C2-C10 alkenyl group substituted or unsubstituted with a halogen, a $C_2$-$C_{10}$ alkynyl group substituted or unsubstituted with a halogen, a $C_5$-$C_{10}$ cycloalkyl group substituted or unsubstituted with a halogen, a $C_7$-$C_{20}$ alkylaryl group substituted or unsubstituted with a halogen, a $C_3$-$C_{20}$ alkylheteroaryl group substituted or unsubstituted with a halogen, or a trialkylsilyl group substituted or unsubstituted with a halogen, wherein one or more alkyl group(s) of the trialkylsilyl group may each independently be a $C_1$-$C_5$ alkyl group, a bond A1-A2 may be the first bond, and a bond A1-R1 or a bond A2-R2 may be the second bond, and the halogen may be fluorine (F), chloride (Cl), bromine (Br), or iodine (I).

For example, regarding the method of preparing the 2D transition metal chalcogenide nanostructure, the chalcogen precursor may be a compound represented by Formula 2 or 3:

$$R3\text{-}A3\text{-}A4\text{-}R4 \qquad \text{<Formula 2>}$$

$$A0\text{-}R5\text{-}A3\text{-}A4\text{-}R6\text{-}Ar2. \qquad \text{<Formula 3>}$$

In Formulae 2 and 3, A1 and A2 may each independently be sulfur (S), selenium (Se), or tellurium (Te), R3 and R4 may each independently be a methyl group substituted or unsubstituted with a halogen, an ethyl group substituted or unsubstituted with a halogen, a propyl group substituted or unsubstituted with a halogen, an isopropyl group substituted or unsubstituted with a halogen, a butyl group substituted or unsubstituted with a halogen, an isobutyl group substituted or unsubstituted with a halogen, a tert-butyl group substituted or unsubstituted with a halogen, or an allyl group substituted or unsubstituted with a halogen, R5 and R6 may each independently a methylene group substituted or unsubstituted with a halogen, an ethylene group substituted or unsubstituted with a halogen, a propylene group substituted or unsubstituted with a halogen, or a butylene group substituted or unsubstituted with a halogen, and A0 and Ar2 may each independently be a phenyl group substituted or unsubstituted with a halogen, a biphenyl group substituted or unsubstituted with a halogen, a naphthyl group substituted or unsubstituted with a halogen, or a benzyl group substituted or unsubstituted with a halogen, wherein the halogen may be F, Cl, Br, or I.

For example, regarding the method of preparing the 2D transition metal chalcogenide nanostructure, the chalcogen precursor may be a compound represented by Formula 4 or 5:

$$R7\text{-}Se\text{---}Se\text{---}R8 \qquad \text{<Formula 4>}$$

$$Ar3\text{-}R9\text{-}Se\text{---}Se\text{-}R10\text{-}Ar4. \qquad \text{<Formula 5>}$$

In Formulae 4 and 5, R7 and R8 may each independently be a methyl group substituted or unsubstituted with a halogen, an ethyl group substituted or unsubstituted with a halogen, a propyl group substituted or unsubstituted with a halogen, R9 and R10 may each independently be a methylene group substituted or unsubstituted with a halogen or an ethylene group substituted or unsubstituted with a halogen, and Ar3 and Ar4 may each independently be a phenyl group substituted or unsubstituted with a halogen, a biphenyl group substituted or unsubstituted with a halogen, a naphthyl group substituted or unsubstituted with a halogen, or a benzyl group substituted or unsubstituted with a halogen.

For example, regarding the method of preparing the 2D transition metal chalcogenide nanostructure, the chalcogen precursor may be a compound represented by Formula 6:

$$M_a(R_1)_{6\text{-}b\text{-}c}(H)_b(R_2)_c. \qquad \text{<Formula 6>}$$

In Formula 6, M may be a transition metal, $R_1$ and $R_2$ may each independently be hydrogen, a $C_1$-$C_{10}$ alkyl group, a $C_2$-$C_{10}$ alkenyl group, a carbonyl group (C=O), a halide, a $C_6$-$C_{10}$ aryl group, a $C_6$-$C_{10}$ cycloalkyl group, a $C_6$-$C_{10}$ cycloalkenyl group, (C=O) R (where R is hydrogen or a $C_1$-$C_{10}$ alkyl group), a $C_1$-$C_{10}$ alkoxy group, a $C_1$-$C_{10}$ amidinate group, a $C_1$-$C_{10}$ alkylamide group, a $C_1$-$C_{10}$ alkylimide group, —N(R)(R') (where R and R' are each independently a $C_1$-$C_{10}$ alkyl group or hydrogen), R(C=O)CN (where R is hydrogen or a $C_1$-$C_{10}$ alkyl group), or a $C_1$-$C_{10}$ β-diketonate, "a" may be 1 or 2, "b" may be an integer of 0 to 3, and "c" may be an integer of 0 to 3, and a case where $R_1$ and $R_2$ are both hydrogen is excluded.

For example, regarding the method of preparing the 2D transition metal chalcogenide nanostructure, the transition metal precursor may be a compound represented by Formula 6a, 6b, or 6c:

$$M(R_1)_6 \qquad \text{<Formula 6a>}$$

in Formula 6a, M may be tungsten (W) or molybdenum (Mo); and one or more $R_1$(s) may each independently be one of a carbonyl group (CO), a propylcyclopentadienyl group, a bicyclo[2.2.1]hepta-2,5-diene group, a cycloheptatriene group, and an acetonitrile group, $$M(R_1)_3 \qquad \text{<Formula 6b>}$$

in Formula 6b, M may be W or Mo; and one or more $R_1$(s) may each independently be one of CO, a propylcyclopentadienyl group, a bicyclo[2.2.1]hepta-2,5-diene group, a cycloheptatriene group, and an acetonitrile group, and $$M(R_1)_4 \qquad \text{<Formula 6c>}$$

in Formula 6c, M may be W or Mo; and one or more $R_1$(s) may each independently be one of CO, a propylcyclopentadienyl group, a bicyclo[2.2.1]hepta-2,5-diene group, a cycloheptatriene group, and an acetonitrile group.

For example, regarding the method of preparing the 2D transition metal chalcogenide nanostructure, a transition metal chalcogenide (TMC) constituting the 2D nanostructure may be a compound represented by Formula 7:

$$M_bY_c. \qquad \text{<Formula 7>}$$

In Formula 7, M may be zirconium (Zr), titanium (Ti), hafnium (Hf), vanadium (V), niobium (Nb), tantalum (Ta), Mo, W, technetium (Tc), rhenium (Re), cobalt (Co), rhodium (Rh), iridium (Ir), nickel (Ni), palladium (Pd), or platinum (Pt), Y may be S, Se, or Te, b may be 1 or 2, and c may be an integer of 1 to 3.

For example, regarding the method of preparing the 2D transition metal chalcogenide nanostructure, the TMC may be a compound represented by Formula 8:

$$MY_2. \qquad \text{<Formula 8>}$$

In Formula 8, M may be Zr, Ti, Hf, V, Nb, Ta, Mo, W, Tc, Re, Co, Rh, Ir, Ni, Pd, or Pt, and Y may be S, Se, or Te.

For example, regarding the method of preparing the 2D transition metal chalcogenide nanostructure, the solvent may include at least one of oleyamine, trioctylphosphine oxide (TOPO), tetradecylphosphonic acid (TDPA), oleic acid, oleyl alcohol, octadecene, trioctylphosphine (TOP), and dodecylamine, but example embodiments are not limited thereto. Any material available in the art as the solvent used for the 2D transition metal chalcogenide nanostructure may be used.

Regarding the example method of preparing the 2D transition metal chalcogenide nanostructure, the reaction between the transition metal precursor and the chalcogen precursor may be performed at a temperature in a range of about 250° C. to about 400° C. for about 10 to about 30 hours. For example, the reaction between the transition metal precursor and the chalcogen precursor may be performed at a temperature in a range of about 280° C. to about 380° C. for about 15 to about 25 hours. For example, the reaction between the transition metal precursor and the chalcogen precursor may be performed at a temperature in a range of about 300° C. to about 350° C. for about 15 to 25 hours. For example, the reaction between the transition metal precursor and the chalcogen precursor may be performed at a temperature in a range of about 310° C. to about 350° C. for about 17 to 23 hours. Within such reaction temperature and reaction time ranges, a 2D transition metal chalcogenide nanostructure may be prepared with high efficiency. When the reaction temperature is about 250° C. or less, due to insufficient supply of heat for synthesis, a prepared 2D nanostructure may not be completely reduced, but may be partially oxidized. When the reaction temperature is higher than about 400° C., due to evaporation of oleyamine used as the solvent for the reaction, the reaction may be difficult to proceed stably. When the reaction time is less than about 10 hours, due to insufficient time for 2D growth, a prepared 2D nanostructure may have a low yield and have a size measured in several nanoscales. When the reaction time is more than 30 hours, due to loss of the solvent by a reaction occurring for a long time, a prepared 2D nanostructure may have a twisted structure.

Regarding the example method of preparing the 2D transition metal chalcogenide nanostructure, the reaction between the transition metal precursor and the chalcogen precursor may be initiated by radicals produced by decomposition of the second bond in the chalcogen precursor.

For example, regarding the example method of preparing the 2D transition metal chalcogenide nanostructure, since the size of the second bond may be similar to the size of the first bond or the binding energy of the second bond may be smaller than the binding energy of the first bond in the chalcogen precursor, the second bond may be decomposed first before the first bond, and may be subsequently decomposed at a similar rate with the first bond, thereby generating radicals. The radicals may be used to initiate the reaction. For example, in a compound $C_6H_5—CH_2—Se—Se—CH_2—C_6H_5$, a binding energy of a second bond, Se—C, may be 48.50 kcal/mol, and a binding energy of a first bond, Se—Se, may be 62.45 kcal/mol, and in this regard, the Se—C bond having a smaller binding energy than the binding energy of the Se—Se bond may be decomposed first to proceed a radical reaction. For example, in a compound $CH_3—Se—Se—CH_3$, a binding energy of a second bond, Se—$CH_3$, may be 53.76 kcal/mol, and a binding energy of a first bond, Se—Se, may be 51.94 kcal/mol, and in this regard, since the binding energies are similar, the Se—C bond and the Se—Se bond may be decomposed competitively to proceed a radical reaction. Therefore, in compounds $C_6H_5—CH_2—Se—Se—CH_2—C_6H_5$ and $CH_3—Se—Se—CH_3$, a reaction may be preceded by homolysis of the Se—C bond, and $C_6H_5—CH_2—Se—Se$ radicals and $CH_3—Se—Se$ radicals may be mainly involved in the reaction. However, for example, in a compound $C_6H_5—Se—Se—C_6H_5$, a binding energy of a second bond, Se—C, may be 64.44 kcal/mol, and a binding energy of a first bond, Se—Se, may be 43.63 kcal/mol, and in this regard, the Se—Se bond having a smaller binding energy than the binding energy of the Se—C bond may be decomposed first to proceed a radical reaction. Therefore, in the compound $C_6H_5—Se—Se—C_6H_5$, a reaction may be preceded by homolysis of the Se—Se bond and $C_6H_5—Se$ radicals may be mainly involved in the reaction. Therefore, regarding the method of preparing the 2D transition metal chalcogenide nanostructure, since the size of the second bond may be similar to the size of the first bond or the binding energy of the second bond may be smaller than the binding energy of the first bond in the chalcogen precursor, the reaction proceeds by a reaction path that is different from the chalcogen precursor in which the second bond is larger than the first bond, and accordingly, a prepared 2D transition metal chalcogenide nanostructure may also have a different structure and properties. In addition, regarding the method of preparing the 2D transition metal chalcogenide nanostructure, a 2D transition metal chalcogenide nanostructure prepared by controlling a binding energy between the second bond and the first bond in the chalcogen precursor may more efficiently control the structure and properties thereof.

In various example embodiments, the 2D transition metal chalcogenide nanostructure may be a TMC, which is a compound represented by Formula 7, wherein a peak corresponding to 4f orbital of metal M of Formula 7 may be shifted to a direction of increasing a binding energy of the peak in the XPS spectrum, after performing a rapid thermal annealing (RTA) process, and the peak is shifted by an interval of 1 electron volts (eV) or less:

$$M_bY_c. \qquad \text{<Formula 7>}$$

In Formula 7, M may be Zr, Ti, Hf, V, Nb, Ta, Mo, W, Tc, Re, Co, Rh, Ir, Ni, Pd, or Pt, Y may be S, Se, or Te, "b" may be 1 or 2, and "c" may be 1, 2, or 3.

In the 2D transition metal chalcogenide nanostructure, before and after performing a rapid thermal annealing (RTA) process, a peak corresponding to 4f orbital of metal M of Formula 7 may be shifted to a direction of increasing a binding energy in the XPS spectrum, wherein the peak may be shifted by 1 electron volts (eV) or less. Due to the peak shift at a low extent, the resultant 2D transition metal chalcogenide nanostructure may be reduced or suppressed from structural changes upon heat treatment. In addition, a content of organic residues remaining during the preparation process of the 2D transition metal chalcogenide nanostructure may be minimized.

For example, in the 2D transition metal chalcogenide nanostructure, before and after performing the RTA process, a peak corresponding to 4f orbital of metal M of the formula below may be shifted between about 0.1 eV to about 1.0 eV to a direction of increasing a binding energy of the peak in the XPS spectrum. For example, in the 2D transition metal chalcogenide nanostructure, before and after performing the RTA process, a peak corresponding to 4f orbital of metal M of the formula below may be shifted between 0.1 eV to 0.8 eV to a direction of increasing a binding energy of the peak in the XPS spectrum. For example, in the 2D transition metal chalcogenide nanostructure, before and after performing the RTA process, a peak corresponding to 4f orbital of metal M of the formula below may be shifted between about 0.1 eV to about 0.7 eV to a direction of increasing a binding energy of the peak in the XPS spectrum. For example, in the 2D transition metal chalcogenide nanostructure, before and after performing the RTA process, a peak corresponding to 4f orbital of metal M of the formula below may be shifted between about 0.1 eV to about 0.6 eV to a direction of increasing a binding energy of the peak in the XPS spectrum. For example, in the 2D transition metal chalcogenide nanostructure, before and after performing the RTA process, a peak corresponding to 4f orbital of metal M of the formula below may be shifted between about 0.1 eV to about 0.5 eV to a direction of increasing a binding energy of the peak in the XPS spectrum.

The RTA process may be performed on the 2D transition metal chalcogenide nanostructure at a temperature in a range of about 250° C. to about 400° C. for about 10 hours to 30 hours. By performing the RTA process on the 2D transition metal chalcogenide nanostructure, impurities including residual organic substances may be removed, and the structural stability of the 2D transition metal chalcogenide nanostructure may be improved. For example, the RTA process may be performed on the 2D transition metal chalcogenide nanostructure at a temperature in a range of about 300° C. to about 400° C. for about 15 hours to about 25 hours. For example, the RTA process may be performed on the 2D transition metal chalcogenide nanostructure at a temperature in a range of about 300° C. to about 350° C. for about 17 hours to about 23 hours. Under the conditions for the RTA process, impurities may be effectively removed, and the structural stability of the 2D transition metal chalcogenide nanostructure may be improved.

For example, the 2D transition metal chalcogenide nanostructure may include a carbon atom bonded to a chalcogen element of the TMC represented by Formula 7, wherein the carbon atom may be a residue and/or a carbide of organic compounds used in the preparation of the 2D transition metal chalcogenide nanostructure.

For example, in the XPS spectrum of the TMC represented by Formula 7 in the 2D transition metal chalcogenide nanostructure, a ratio (I2/I1) of a peak intensity of a chalcogen-carbon bond (I2) having a binding energy in a range of about 56 eV to about 58 eV to a peak intensity (I1) of a chalcogen element having a binding energy in a range of about 54 eV to about 56 eV may be less than or equal to about 0.1. For example, in the XPS spectrum of the TMC represented by Formula 7 in the 2D transition metal chalcogenide nanostructure, a ratio (I2/I1) of a peak intensity of a chalcogen-carbon bond (I2) having a binding energy in a range of about 56 eV to about 58 eV to a peak intensity (I1) of a chalcogen element having a binding energy in a range of about 54 eV to about 56 eV may be less than or equal to about 0.08. For example, in the XPS spectrum of the TMC represented by Formula 7 in the 2D transition metal chalcogenide nanostructure, a ratio (I2/I1) of a peak intensity of a chalcogen-carbon bond (I2) having a binding energy in a range of about 56 eV to about 58 eV to a peak intensity (I1) of a chalcogen element having a binding energy in a range of about 54 eV to about 56 eV may be less than or equal to 0.06. For example, in the XPS spectrum of the TMC represented by Formula 7 in the 2D transition metal chalcogenide nanostructure, a ratio (I2/I1) of a peak intensity of a chalcogen-carbon bond (I2) having a binding energy in a range of about 56 eV to about 58 eV to a peak intensity (I1) of a chalcogen element having a binding energy in a range of about 54 eV to about 56 eV may be less than or equal to 0.05. That is, the TMC represented by Formula 7 in the 2D transition metal chalcogenide nanostructure may not substantially include a Si—C bond, or may include a Si—C bond only in a small amount to the extent not detectable in the XPS spectrum.

For example, the 2D transition metal chalcogenide nanostructure may include a TMC represented by Formula 8:

$$MY_2. \qquad \text{<Formula 8>}$$

In Formula 8, M may be Zr, Ti, Hf, V, Nb, Ta, Mo, W, Tc, Re, Co, Rh, Ir, Ni, Pd, or Pt; and
Y may be S, Se, or Te.

For example, the 2D transition metal chalcogenide nanostructure may include a TMC represented by Formula 9:

$$MSe_2. \qquad \text{<Formula 9>}$$

In Formula 9, M may be Zr, Ti, Hf, V, Nb, Ta, Mo, W, Tc, Re, Co, Rh, Ir, Ni, Pd, or Pt.

Figure 1B:
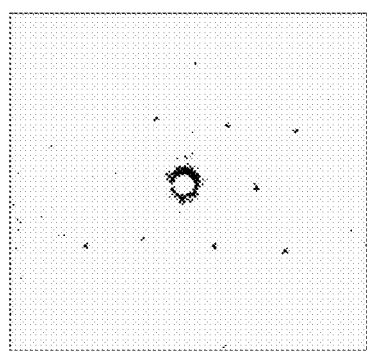
FIG. 1B depicts a selected area electron diffraction (SAED) patterns of the 2D WSe$_2$ 2D nanostructure of Example 1 shown in FIG. 1A.
Figure 1C:
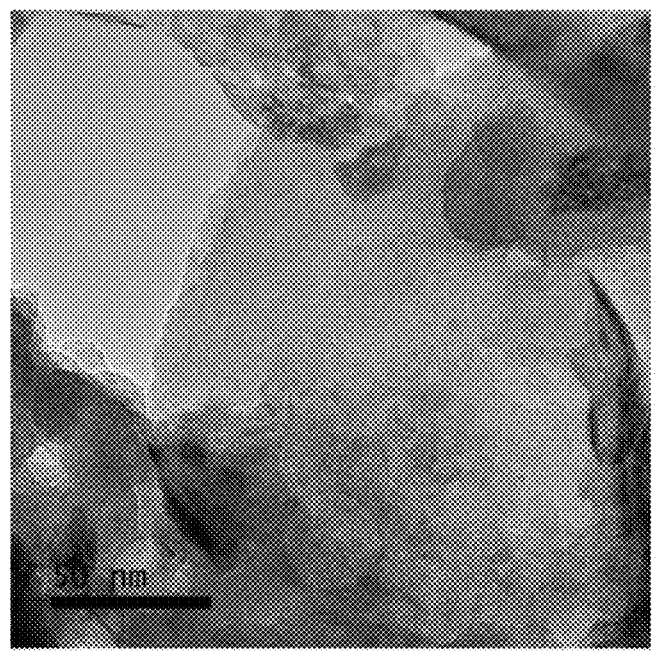
FIG. 1C is a TEM image showing the 2D WSe$_2$ 2D nanostructure of Example 1 at a different scale.

For example, the 2D transition metal chalcogenide nanostructure may have single crystallinity. For example, as shown in FIG. 1 and selected area electron diffraction (SAED) patterns of the 2D transition metal chalcogenide nanostructure in FIG. 1B, the transition metal chalcogenide may have single crystallinity.

For example, the 2D transition metal chalcogenide nanostructure may have a 2H phase and exhibit semiconducting properties. Accordingly, the 2D transition metal chalcogenide nanostructure having semiconducting properties may be used for various electronic devices.

According to another example embodiment, a device includes the 2D transition metal chalcogenide nanostructure.

As described above, a size and a thickness of the device may be easily controlled, and due to the inclusion of the 2D transition metal chalcogenide nanostructure having semiconducting properties, characteristics of the device may be more easily controlled.

For example, the device including the 2D transition metal chalcogenide nanostructure may be a transistor, but example embodiments are not limited thereto. Any device may be used as long as a material having semiconducting characteristics is suitable for the device.

A substituent used herein may be derived by replacing one or more hydrogens with other atoms or functional groups in an unsubstituted mother group. In other words, assuming a functional group is considered to be "substituted", it is understood that a functional group is substituted with at least one of a C1-C40 alkyl group, a C2-C40 alkenyl group, a C2-C40 alkynyl group, a C3-C40 cycloalkyl group, a C3-C40 cycloalkenyl group, and a C7-C40 aryl group. The expression that a functional group is "optionally substituted" means that a functional group may be substituted with a substituent provided herein.

In the term "Ca-Cb" used herein, "a" and "b" each independently indicate a number of carbon atoms in a particular functional group. That is, a functional group may include "a" to "b" carbon atom(s). For example, the term "C1-C4 alkyl group" used herein refers to an alkyl group having 1 to 4 carbon atoms, and examples thereof include $CH_3$—, $CH_3CH_2$—, $CH_3CH_2CH_2$—, $(CH_3)_2CH$—, $CH_3CH_2CH_2CH_2$—, $CH_3CH_2CH(CH_3)$—, and $(CH_3)_3C$—.

Regarding the nomenclature for a particular radical, a mono-radical or a di-radical may be used depending on the context. For example, if a substituent requires two connecting points to the remaining molecule, the substituent should be understood as a di-radical. For example, a substituent specified as an alkyl group requiring two connecting points may include a di-radical, such as —$CH_2$—, —$CH_2CH_2$—, and —$CH_2CH(CH_3)CH_2$—. The nomenclature for other radicals, such as "akylene", clearly indicates that the radical is a di-radical.

The term "an alkyl group" or "an alkylene group" used herein refers to a branched or unbranched aliphatic hydrocarbon group. In an example embodiment, an alkyl group may be substituted or unsubstituted. Examples of an alkyl group may include a methyl group, an ethyl group, a propyl group, an isopropyl group, a butyl group, an isobutyl group, a tert-butyl group, a pentyl group, a hexyl group, a cyclopropyl group, a cyclopentyl group, a cyclohexyl group, and a cycloheptyl group, but example embodiments are not limited thereto, wherein each group may be optionally substituted or unsubstituted. In an example embodiment, an alkyl group may have 1 to 6 carbon atoms. Examples of a C1-C6 alkyl group may include a methyl group, an ethyl group, a propyl group, an isopropyl group, a butyl group, an iso-butyl group, a sec-butyl group, a pentyl group, a 3-pentyl group, and a hexyl group, but are not limited thereto.

The term "an alkenyl group" used herein refers to a hydrocarbon group including 2 to 20 carbon atoms and at least one carbon-carbon double bond, and examples thereof may include, although not limited thereto, an ethenyl group, a 1-propenyl group, a 2-propenyl group, a 2-methyl-1-propenyl group, a 1-butenyl group, a 2-butenyl group, a cyclopropenyl group, a cyclopentenyl group, a cyclohexenyl group, and a cycloheptenyl group. In an example embodiment, an alkenyl group may be substituted or unsubstituted. In an example embodiment, an alkenyl group may include 2 to 40 carbon atoms.

The term "an alkynyl group" used herein refers to a hydrocarbon group including 2 to 20 carbon atoms and at least on carbon-carbon triple bond, and examples thereof, although not limited thereto, may include an ethyl group, a 1-propynyl group, a 1-butynyl group, and a 2-butynyl group, but are not limited thereto. In an embodiment, an alkynyl group may be substituted or unsubstituted. In an embodiment, an alkynyl group may include 2 to 40 carbon atoms.

The term "a cycloalkyl group" used herein refers to a completely saturated carbocyclic ring or ring system, and examples thereof may include a cyclopropyl group, a cyclobutyl group, a cyclopentyl group, and a cyclohexyl group.

The term "aromatic" used herein refers to a ring or ring system having a pi-conjugated electron system, and examples thereof may include an aromatic carbon ring (for example, a phenyl group) and a heteroaromatic ring (for example, a pyridine group). This term also refers to a monocyclic ring or a fused polycyclic ring (that is, a ring sharing adjacent pairs of atoms, as long as the entire ring system is aromatic.

The term "an aryl group" used herein refers to an aromatic ring of which a ring skeleton consists of carbon atoms only, a ring system (that is, a ring in which two or more rings requiring two adjacent carbon atoms are fused), or a ring in which a plurality of aromatic rings are connected to each other via a single bond, —O—, —S—, —C(=O)—, —S(=O)2-, —Si(Ra)(Rb)— (where Ra and Rb are each independently an C1-C10 alkyl group), a C1-C10 alkylene group substituted or unsubstituted with a halogen, or —C(=O)—NH—. Assuming the aryl group is a ring system, each of rings in the system may be aromatic. Examples of an aryl group may include a phenyl group, a biphenyl group, a naphthyl group, a phenanthrenyl group, and a naphthacenyl group, but are not limited thereto. In an embodiment, an aryl group may be substituted or unsubstituted.

The term "an arylene group" used herein refers to an aryl group requiring two or more connecting points. A tetravalent arylene group refers to an aryl group requiring four connecting points, and a divalent arylene group refers to an aryl group requiring two connecting points. An example of an arylene group may include —C6H5-O—C6H5-.

The term "a heteroaryl group" used herein refers to a single ring, a ring in which a plurality of rings are fused, or an aromatic ring system including a ring in which a plurality of rings are connected to each other via a single bond, —O—, —S—, —C(=O)—, —S(=O)$_2$—, —Si(Ra)(Rb)— (where Ra and Rb are each independently a C1-C10 alkyl group), a C1-C10 alkylene group substituted or unsubstituted with a halogen, or —C(=O)—NH—, wherein at least one ring atom is not a carbon atom, but is a heteroatom. In such a fused ring system, at least one heteroatom may be present in only one ring. For example, a heteroatom may include oxygen, sulfur, and nitrogen, but are not limited thereto. Examples of a heteroaryl group may include a furanyl group, a thienyl group, an imidazolyl group, a quinazolinyl group, a quinolinyl group, an isoquinolinyl group, aquinoxalinyl group, a pyridinyl group, a pyrrolyl group, an oxazolyl group, and an indolyl group, but are not limited thereto.

The term "a heteroarylene group" used herein refers to a heteroaryl group requiring two or more connecting points. A tetravalent heteroarylene group refers to a heteroaryl group requiring four connecting points, and a divalent heteroarylene group refers to a heteroaryl group requiring two connecting points.

The term "an aralkyl group" or "an alkylaryl group" used herein refers to an aryl group connected as a substituent via an alkylene group, such as a C7-C14 aralkyl group, and examples thereof may include, although not limited thereto, a benzyl group, a 2-phenylethyl group, a 3-phenylpropyl group, and a naphtylalkyl group. In an example embodiment, an alkylene group may be a lower alkyl group (that is, a C1-C4 alkylene group).

The term "a cycloalkenyl group" used herein refers to a carbocyclic ring or ring system including at least one carbon-carbon double bond, wherein such a carbocyclic ring or ring system is an aromatic ring-free ring system, and an example thereof may include a cyclohexenyl group.

The term "a halogen" used herein refers to a stable element belonging to Group 17 of the Periodic Table of the Elements, and examples thereof may include F, Cl, Br, or I. In an embodiment, a halogen may be F and/or Cl.

Hereinafter, one or more example embodiments will be described in more detail with reference to the following examples. However, these examples are not intended to limit the scope of the one or more embodiments.

Preparation of 2D Transition Chalcogenide Nanostructure

Example 1: Synthesis of WSe$_2$ Using CH$_3$—Se—Se—CH$_3$ Precursor 0.02 mmol of a tungsten hexacarbonyl (W(CO)$_6$) precursor and 10.5 mmol of an oleyamine solvent were added to a 25 mL three-neck round-bottom flask under an argon (Ar) atmosphere, thereby preparing a composition.

Under Ar gas flow, a temperature of the composition was heated to about 330° C. at a rate of about 8.5° C./minute, and about 0.04 mmol of a dimethyl-diselenide (CH$_3$—Se—Se—CH$_3$) chalcogen precursor dissolved in about 3.5 mmol of an oleyamine solvent was subsequently injected with a syringe into the flask.

The composition was allowed to react for about 20 hours while maintaining the temperature at about 330° C., and the resulting composition was subsequently cooled to room temperature. A mixture of excess toluene and butanol mixed at a volume ratio of 2:1 was added to the flask, and centrifugation was performed thereon to obtain a 2D WSe$_2$ nanostructure.

Example 2: Synthesis of WSe$_2$ Using C$_6$H$_5$—CH$_2$—Se—Se—CH$_2$—C$_6$H$_5$ Precursor About 0.02 mmol of a tungsten hexacarbonyl (W(CO)$_6$) precursor and about 10.5 mmol of an oleyamine solvent were added to a 25 mL three-neck round-bottom flask under an Ar atmosphere, thereby preparing a composition.

Under Ar gas flow, a temperature of the composition was heated to about 330°3 at a rate of about 8.5°./minute, and about 0.04 mmol of a dibenzyl-diselenide (C$_6$H$_5$—CH$_2$—Se—Se—CH$_2$—C$_6$H$_5$) chalcogen precursor dissolved in about 3.5 mmol of an oleyamine solvent was subsequently injected with a syringe into the flask.

The composition was allowed to react for about 20 hours while maintaining the temperature at about 330° C., and the resulting composition was subsequently cooled to room temperature. A mixture of excess toluene and butanol mixed at a volume ratio of about 2:1 was added to the flask, and centrifugation was performed thereon to obtain a 2D WSe$_2$ nanostructure.

Example 3: Synthesis of MoSe$_2$ Using CH$_3$—Se—Se—CH$_3$ Precursor

About 0.02 mmol of a molybdenum hexacarbonyl (Mo(CO)$_6$) precursor and about 10.5 mmol of an oleyamine solvent were added to a 25 mL three-neck round-bottom flask under an Ar atmosphere, thereby preparing a composition.

Under Ar gas flow, a temperature of the composition was heated to about 330° C. at a rate of about 8.5° C./minute, and 0.04 mmol of a dimethyl-diselenide (CH$_3$—Se—Se—CH$_3$) chalcogen precursor dissolved in 3.5 mmol of an oleyamine solvent was subsequently injected with a syringe into the flask.

The composition was allowed to react for about 20 hours while maintaining the temperature at about 330° C., and the resulting composition was subsequently cooled to room temperature. A mixture of excess toluene and butanol mixed at a volume ratio of about 2:1 was added to the flask, and centrifugation was performed thereon to obtain a 2D MoSe$_2$ nanostructure.

Example 4: Synthesis of MoSe$_2$ Using C$_6$H$_5$—CH$_2$—Se—Se—CH$_2$—C$_6$H$_5$ Precursor About 0.02 mmol of a molybdenum hexacarbonyl (Mo(CO)$_6$) precursor and about 10.5 mmol of an oleyamine solvent were added to a 25 mL three-neck round-bottom flask under an Ar atmosphere, thereby preparing a composition.

Under Ar gas flow, a temperature of the composition was heated to about 330° C. at a rate of about 8.5° C./minute, and about 0.04 mmol of a dibenzyl-diselenide (C$_6$H$_5$—CH$_2$—Se—Se—CH$_2$—C$_6$H$_5$) chalcogen precursor dissolved in 3.5 mmol of an oleyamine solvent was subsequently injected with a syringe into the flask.

The composition was allowed to react for about 20 hours while maintaining the temperature at about 330° C., and the resulting composition was subsequently cooled to room temperature. A mixture of excess toluene and butanol mixed at a volume ratio of about 2:1 was added to the flask, and centrifugation was performed thereon to obtain a 2D MoSe$_2$ nanostructure.

Comparative Example 1: Synthesis of WSe$_2$ Using C$_6$H$_5$—Se—Se—C$_6$H$_5$ Precursor About 0.02 mmol of a tungsten hexacarbonyl (W(CO)$_6$) precursor and about 10.5 mmol of an oleyamine solvent were added to a 25 mL three-neck round-bottom flask under an Ar atmosphere, thereby preparing a composition.

Under Ar gas flow, a temperature of the composition was heated to about 330° 3 at a rate of 8.5°./minute, and about 0.04 mmol of a diphenyl-diselenide (C6H5-Se—Se—C6H5) chalcogen precursor dissolved in 3.5 mmol of an oleyamine solvent was subsequently injected with a syringe into the flask.

The composition was allowed to react for about 20 hours while maintaining the temperature at about 330° C., and the resulting composition was subsequently cooled to room temperature. A mixture of excess toluene and butanol mixed at a volume ratio of about 2:1 was added to the flask, and centrifugation was performed thereon to obtain a 2D WSe$_2$ nanostructure.

Comparative Example 2: Synthesis of MoSe$_2$ Using C$_6$H$_5$—Se—Se—C$_6$H$_5$ Precursor A 2D MoSe$_2$ nanostructure was synthesized in the same manner as in Comparative Example 1, except that a molybdenum hexacarbonyl (Mo(CO)$_6$) precursor was used instead of the tungsten hexacarbonyl (W(CO)$_6$) precursor.

Preparation of 2D Nanostructure Thin Film

Example 5: Preparation of WSe$_2$ Thin Film

The 2D WSe2 nanostructure of Example 2 was dispersed in chloroform, spin-coated on a silica (SiO$_2$) substrate after preparing a 2D WSe$_2$ nanostructure ink, and subsequently dried to prepare a 2D nanostructure thin film.

Figure 9:
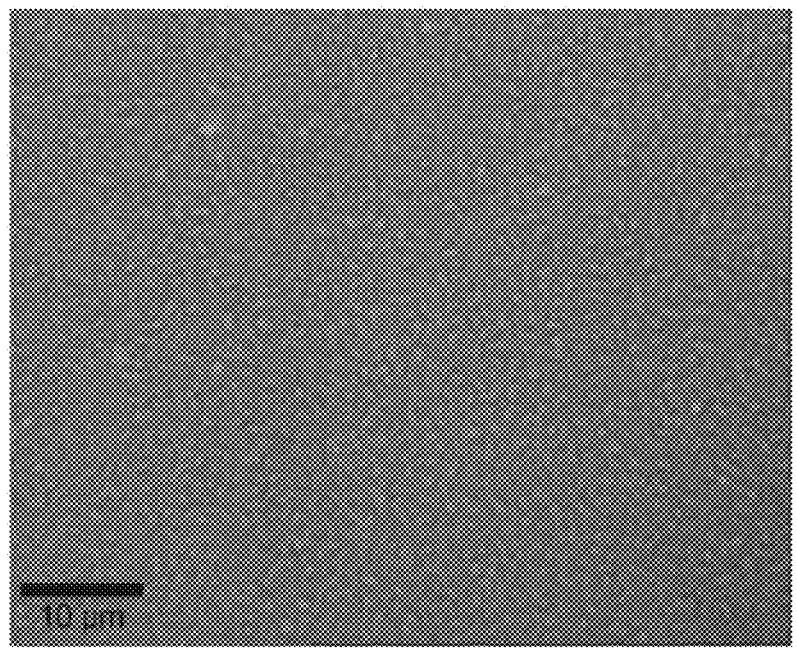
FIG. 9 is a scanning electron microscope (SEM) image showing a thin film prepared by using the 2D WSe$_2$ nanostructure of Example 2.

A scanning electron microscope (SEM) image showing the prepared thin film is shown in FIG. 9.

Therefore, the 2D transition metal chalcogenide nanostructure may be more easily prepared in the form of a thin film, and thus, may be also used as an electrode of a device, such as a transistor.

Evaluation Example 1: TEM Image and SAED Pattern Analysis

Regarding the 2D WSe$_2$ nanostructures of Examples 1 and 2 and Comparative Example 1, TEM images and SAED patterns thereof are shown in FIGS. 1A to 3C.

As shown in FIGS. 1A to 3C, the 2D WSe2 nanostructures of Examples 1 (see FIGS. 1A and 1C) and 2 (see FIGS. 2A and 2C), and Comparative Example 1 (see FIGS. 3A and 3C) each had a 2D nanostructure which is a single-layered structure and/or a multi-layered structure.

Compared to the 2D WSe2 nanostructure of Example 1, the 2D WSe2 nanostructure of Example 2 had a decreased plane direction size and had a multi-layered structure. In addition, compared to the 2D WSe$_2$ nanostructure of Example 1, the 2D WSe$_2$ nanostructure of Comparative Example 1 had a decreased plane direction size. That is, the structure of the 2D transition metal chalcogenide nanostructure obtained according to the structure of the chalcogen precursor may be controlled.

Figure 2A:
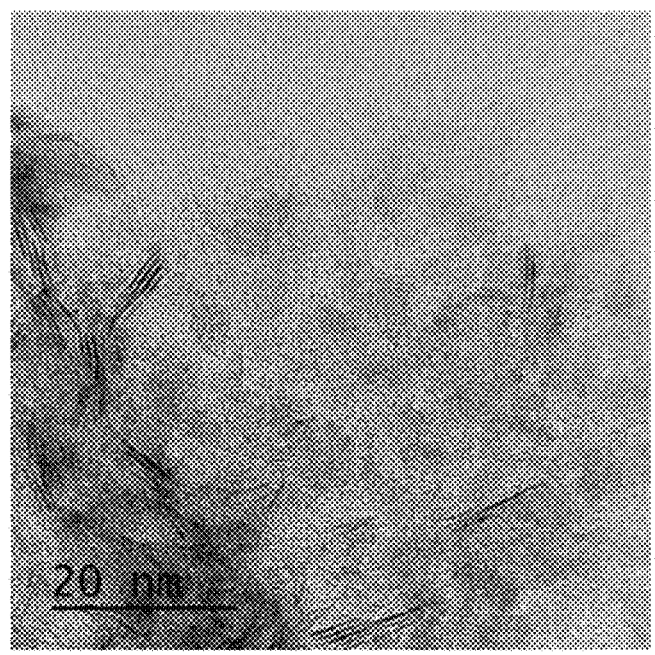
FIG. 2A is a TEM image showing a 2D WSe$_2$ nanostructure prepared according to Example 2.
Figure 2B:
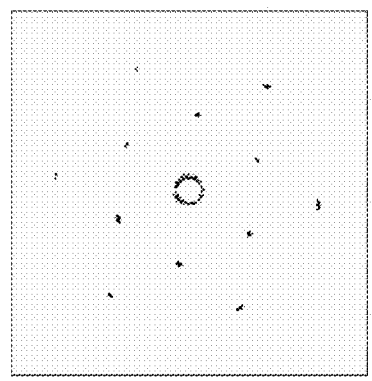
FIG. 2B depicts SAED patterns of the 2D WSe$_2$ nanostructure of Example 2 shown in FIG. 2A.
Figure 2C:
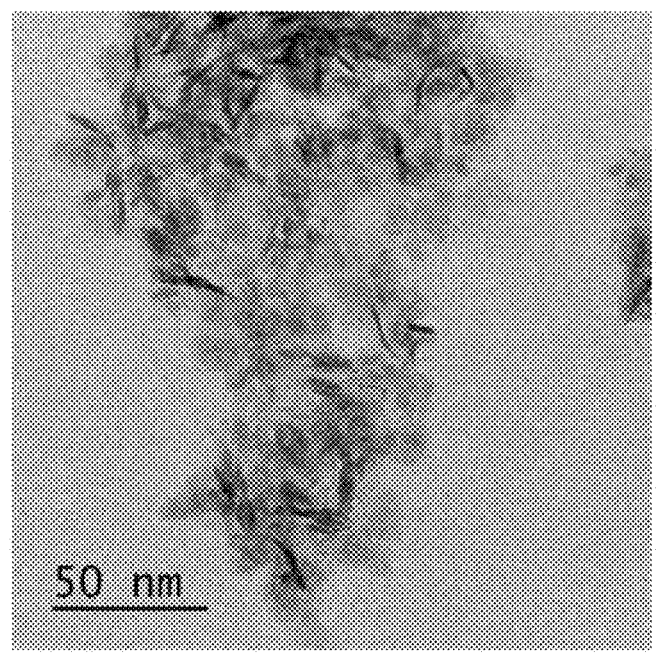
FIG. 2C is a TEM image showing the 2D WSe$_2$ nanostructure of Example 2 at a different scale.
Figure 3A:
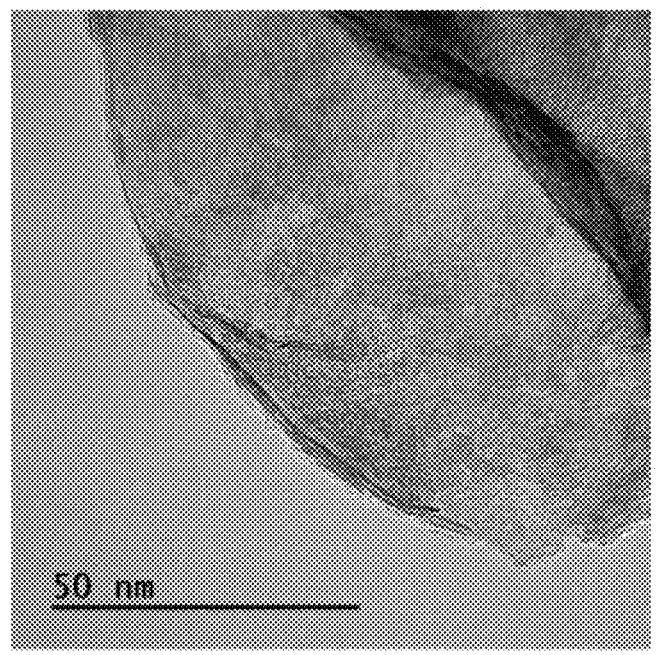
FIG. 3A is a TEM image showing a 2D WSe$_2$ nanostructure prepared according to Comparative Example 1.
Figure 3B:
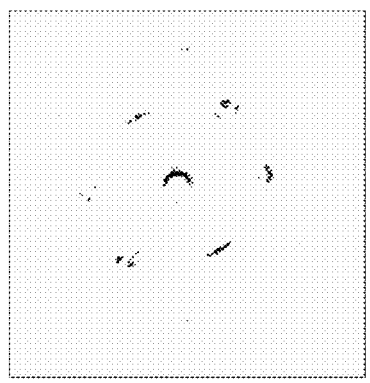
FIG. 3B depicts SAED patterns of the 2D WSe$_2$ nanostructure of Comparative Example 1 shown in FIG. 3A.
Figure 3C:
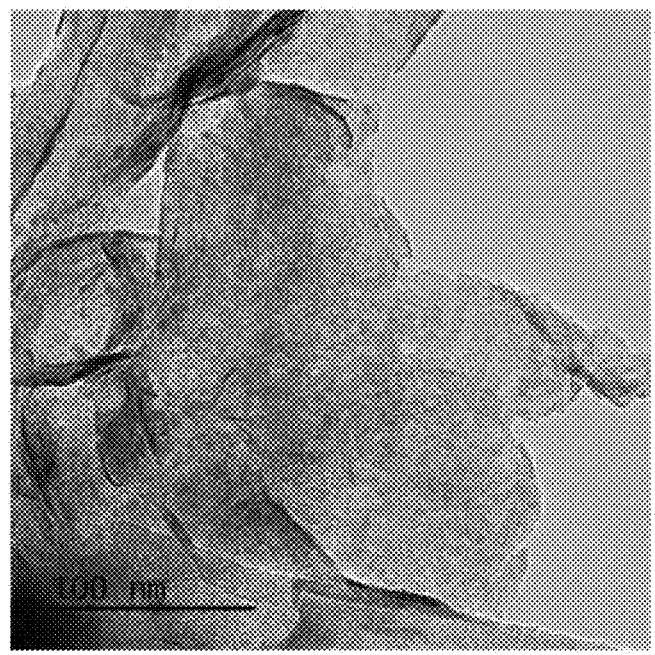
FIG. 3C is a TEM image showing the 2D WSe$_2$ nanostructure of Comparative Example 1 at a different scale.
Figure 4A:
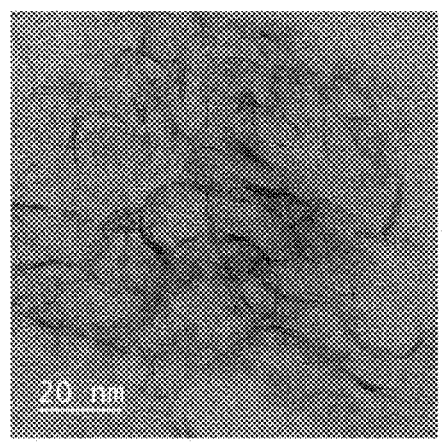
FIG. 4A is a TEM image showing a 2D MoSe$_2$ nanostructure prepared according to Example 3.
Figure 4B:
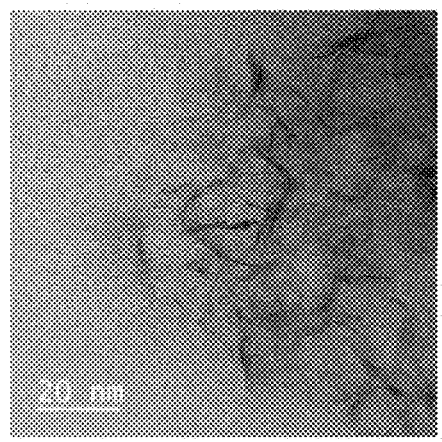
FIG. 4B is a TEM image showing the 2D MoSe2 nanostructure of Example 3 at a different scale.
Figure 5A:
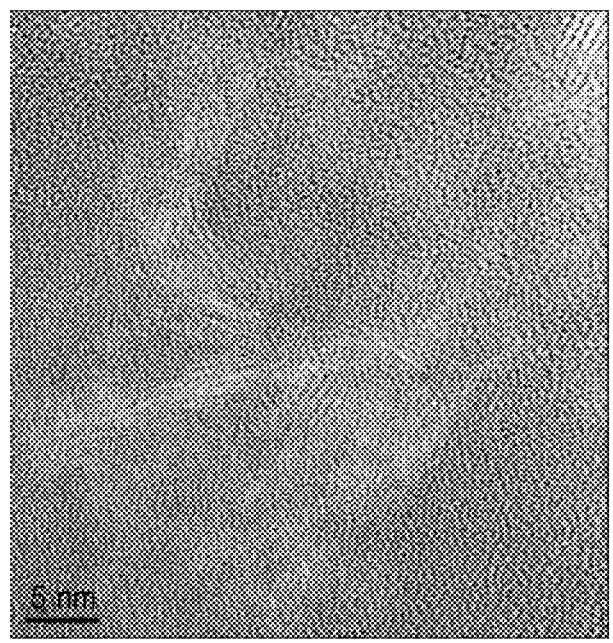
FIG. 5A is a TEM image showing a 2D MoSe$_2$ nanostructure prepared according to Example 4.
Figure 5B:
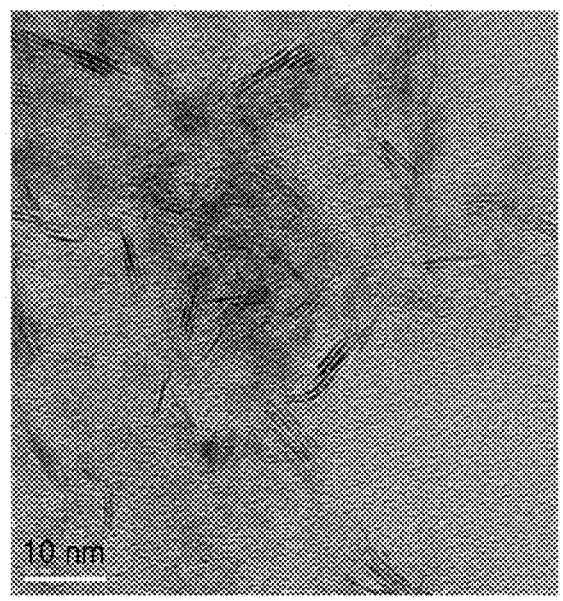
FIG. 5B is a TEM image showing the 2D MoSe$_2$ nanostructure of Example 4 at a different scale.
Figure 6A:
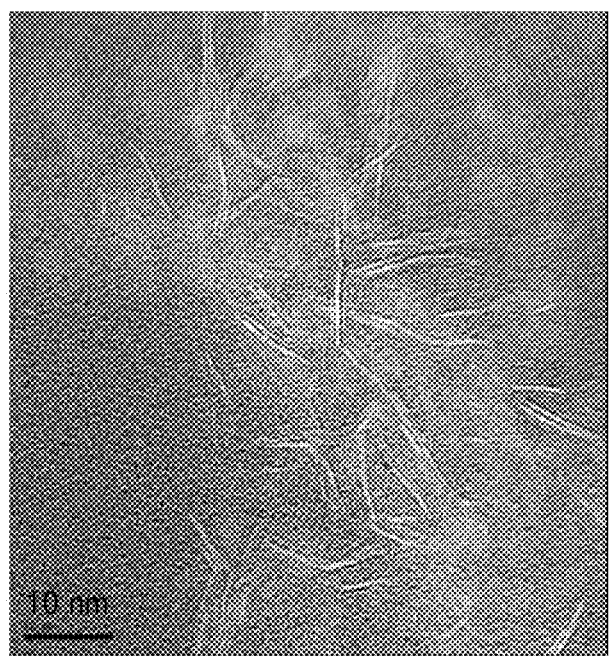
FIG. 6A is a TEM image showing a 2D MoSe$_2$ nanostructure prepared according to Comparative Example 2.
Figure 6B:
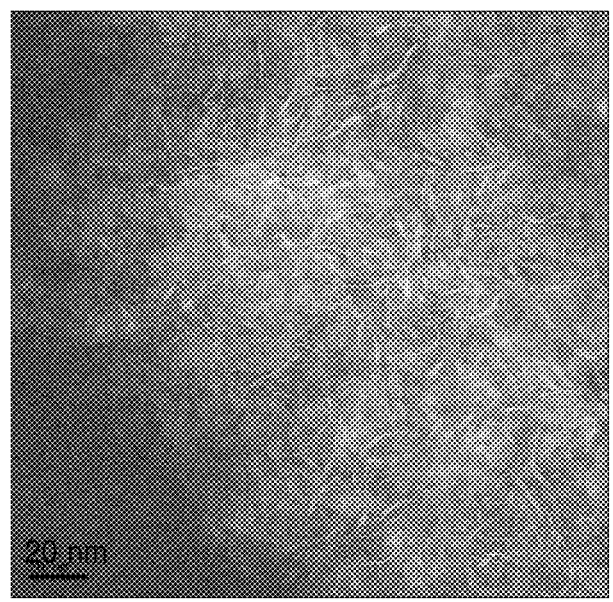
FIG. 6B is a TEM image showing the 2D MoSe$_2$ 2D nanostructure of Comparative Example 2 TEM image showing at a different scale.

However, as shown in the SAED patterns in FIGS. 1B and 2B, the 2D WSe$_2$ nanostructures of Examples 1 and 2 each had single crystallinity. As shown in FIG. 3B, the 2D WSe$_2$ nanostructure of Comparative Example 1 showed degraded regularity of crystals.

In addition, although not shown in the drawings, it was confirmed by high resolution TEM and XPS analysis that the 2D WSe nanostructure of Example 1 mainly had a 2H phase so that exhibited semiconducting properties.

In addition, regarding the 2D MoSe2 nanostructures of Examples 3 and 4 and Comparative Example 2, TEM images and SAED patterns thereof are shown in FIGS. 4A to 6B.

As shown in FIGS. 4A to 6B, the 2D MoSe$_2$ nanostructures of Example 3 (see FIGS. 4A and 4B) and 4 (see FIGS. 5A and 5B) and Comparative Example 1 (see FIGS. 6A and 6B) each had a 2D nanostructure which is a single-layered structure and/or a multi-layered structure.

The 2D MoSe$_2$ nanostructure of Example 3 had a planar size in a range of about 10 nm to about 20 nm, and had a stacked structure of two to three layers.

The 2D MoSe$_2$ nanostructure of Example 4 had a planar size in a range of about 5 nm to about 10 nm, and had a stacked structure of three layers.

The 2D MoSe2 nanostructure of Comparative Example 2 had a planar size in a range of about 15 nm to about 30 nm, and had a single-layered structure or a stacked structure of two to three layers.

Evaluation Example 2: XPS Analysis (I)

The 2D WSe$_2$ nanostructures of Examples 1 and 2 and Comparative Example 1 were subjected to the XPS. Next, after performing an RTA process thereon at a temperature of about 330° C. for about 60 minutes, XPS with respect to the 2D WSe2 nanostructures was performed again, thereby evaluating changes in position of peaks corresponding to 4f orbital of W.

Figure 7A:
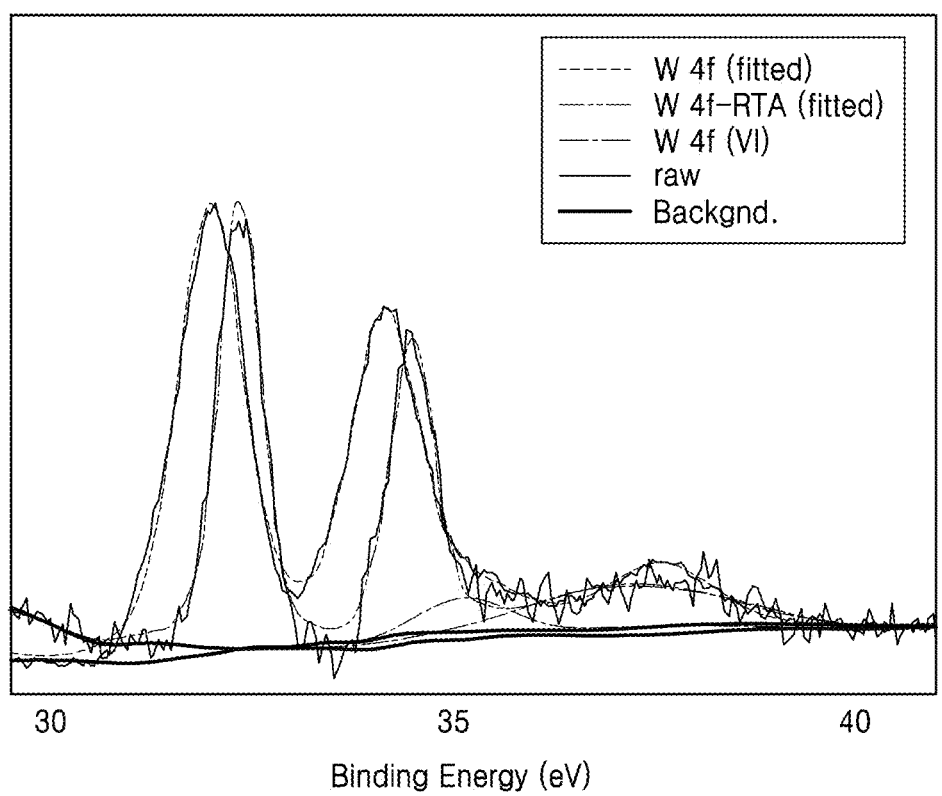
FIG. 7A is an image showing an X-ray photoelectron spectroscopy (XPS) spectrum measured with respect to W 4f orbital of the 2D WSe$_2$ nanostructure prepared of Example 1, before and after performing a rapid thermal annealing (RTA) process thereon.

As shown in FIG. 7A, in the XPS spectrum for the 2D WSe$_2$ nanostructure of Example 1, a peak corresponding to 4F7/2 orbital of M (at 31.98 eV) and a peak corresponding to 4f5/2 orbital of M (at 34.13 eV) were each shifted to a direction of increasing a binding energy of the peak, and were each observed at 32.33 eV and 34.48 eV after performing the RTA process. Here, each of the peaks was shifted by an interval of 0.35 eV and 0.35 eV in the XPS spectrum. As shown in FIG. 7A, W 4f (fitted) corresponds to a peak before performing the RTA process and W 4f-RTA (fitted) corresponds to a peak after performing the RTA process.

Figure 7B:
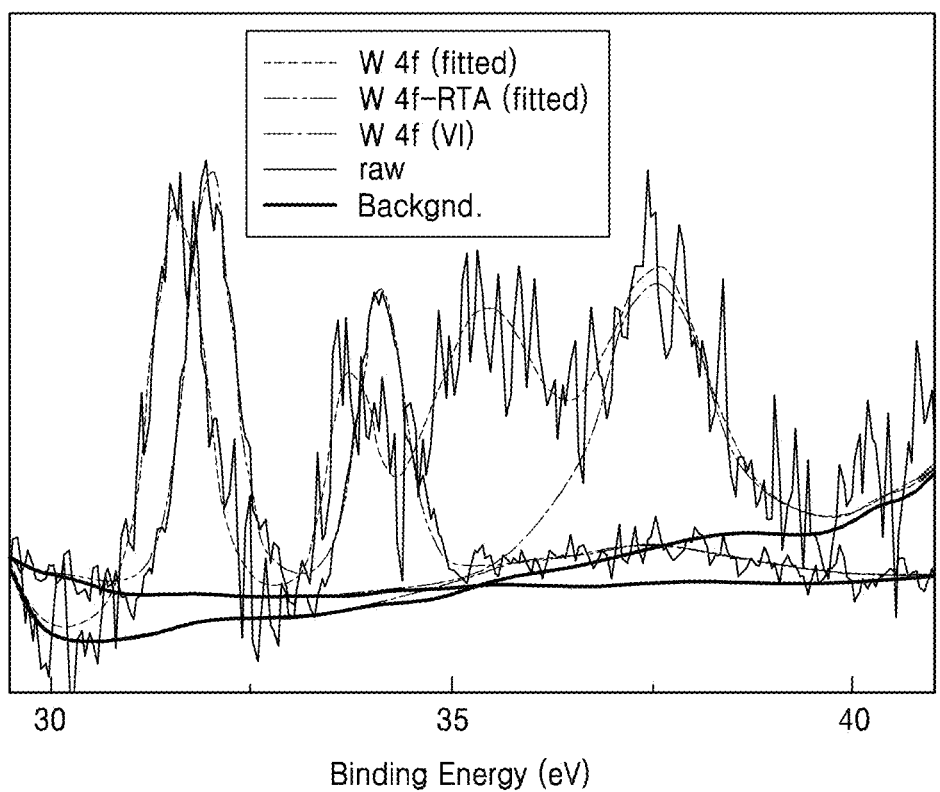
FIG. 7B is an image showing an XPS spectrum measured with respect to W 4f orbital of the 2D WSe$_2$ nanostructure of Example 2, before and after performing an RTA process thereon.

As shown in FIG. 7B, in the XPS spectrum for the 2D WSe$_2$ nanostructure of Example 2, a peak corresponding to 4F7/2 orbital of M (at 31.58 eV) and a peak corresponding to 4f5/2 orbital of M (at 33.78 eV) were each shifted to a direction of increasing a binding energy of the peak, and were each observed at 31.98 eV and 34.13 eV after performing the RTA process. Here, each of the peaks was shifted by an interval of 0.40 eV and 0.35 eV. As shown in FIG. 7B, W 4f (fitted) corresponds to a peak before performing the RTA process and W 4f-RTA (fitted) corresponds to a peak after performing the RTA process.

Figure 7C:
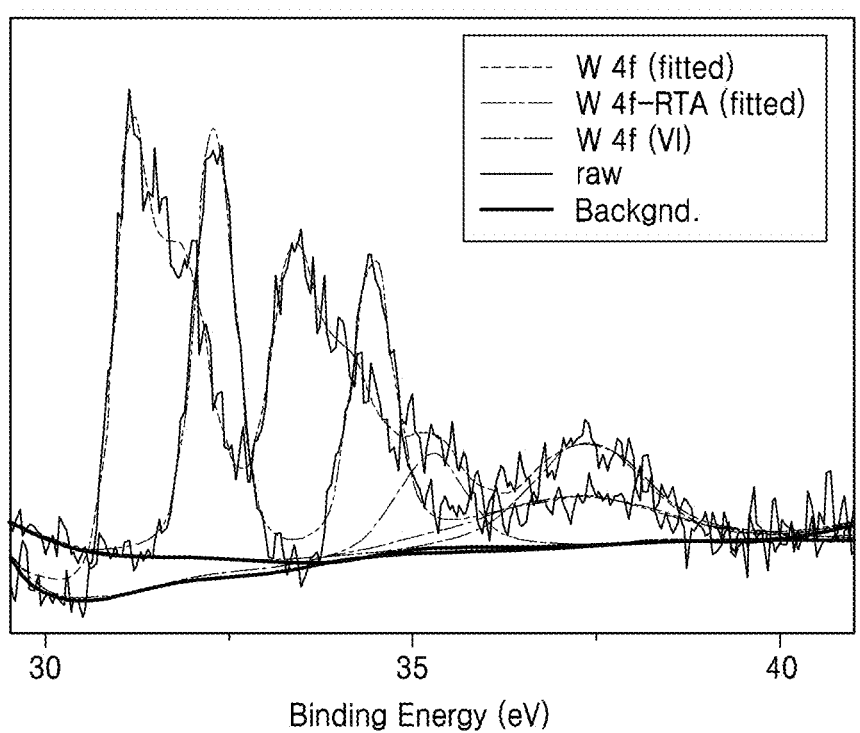
FIG. 7C is an image showing an XPS spectrum measured with respect to W 4f orbital of the 2D WSe$_2$ nanostructure of Comparative Example 1, before and after performing an RTA process thereon.

As shown in FIG. 7C, in the XPS spectrum for the 2D WSe2 nanostructure of Comparative Example 1, a peak corresponding to 4F7/2 orbital of M (at 31.18 eV) and a peak corresponding to 4f5/2 orbital of M (at 33.38 eV) were each shifted to a direction of increasing a binding energy of the peak, and were each observed at 32.28 eV and 34.43 eV after performing the RTA process. Here, the each of the peaks was shifted by an interval of 1.10 eV and 1.05 eV. As shown in FIG. 7C, W 4f (fitted) corresponds to a peak before performing the RTA process and W 4f-RTA (fitted) corresponds to a peak after performing the RTA process.

Therefore, the 2D WSe$_2$ nanostructures of Examples 1 and 2 showed structural stability with the peak shift by an interval of less than 1 eV after the treatment of the RTA process, whereas the 2D WSe$_2$ nanostructure of Comparative Example 1 showed low structural stability due to significant structural changes with the peak shift by an interval of 1 eV or more after the treatment of the RTA process.

Evaluation Example 3: XPS Analysis (II)

Figure 8A:
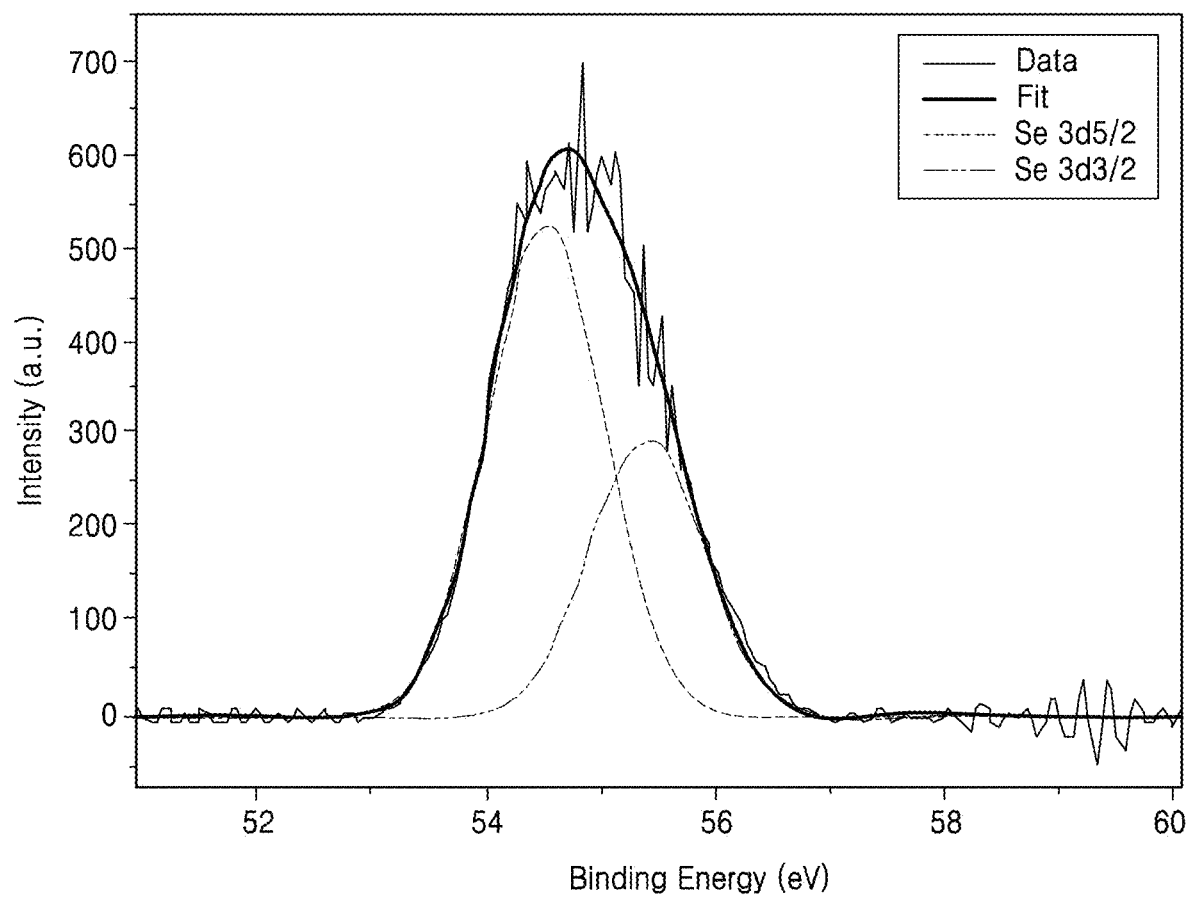
FIG. 8A is an image showing an XPS spectrum measured with respect to Se 3d orbital of the 2D WSe$_2$ nanostructure of Example 1, before and after performing a rapid thermal annealing (RTA) process thereon.
Figure 8B:
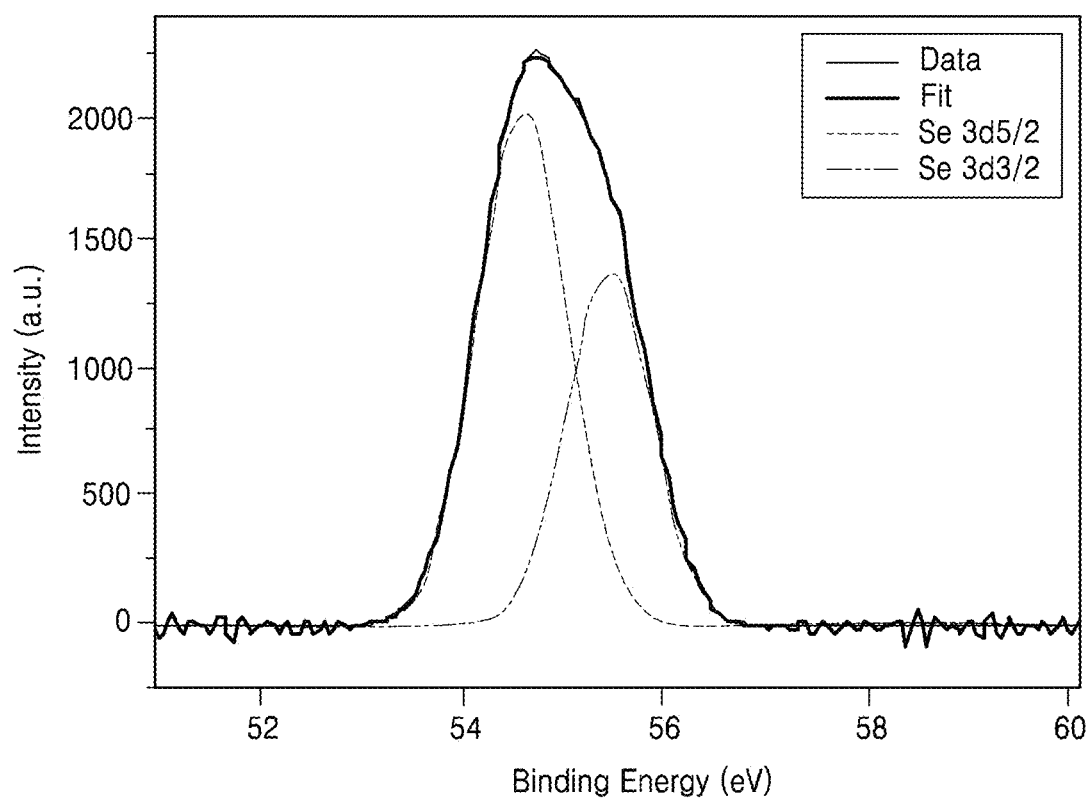
FIG. 8B is an image showing an XPS spectrum measured with respect to Se 3d orbital of the 2D WSe$_2$ nanostructure of Example 2, before and after performing an RTA process thereon.
Figure 8C:
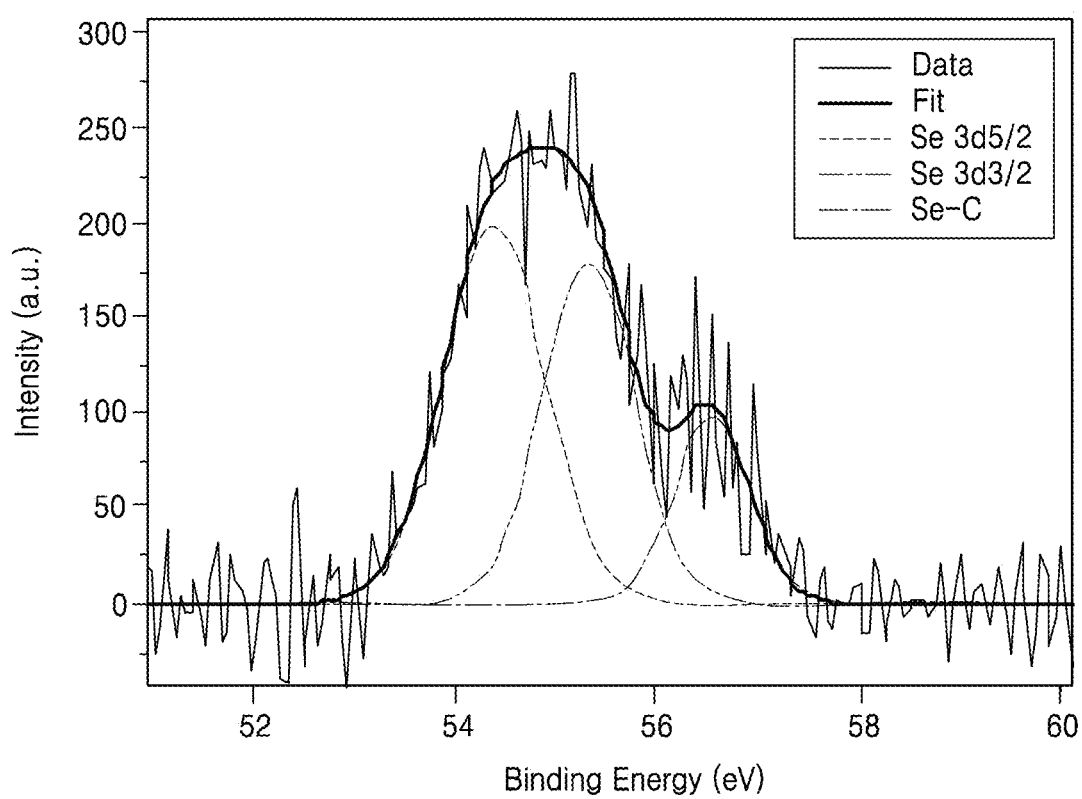
FIG. 8C is an image showing an XPS spectrum measured with respect to Se 3d orbital of the 2D WSe$_2$ nanostructure of Comparative Example 1, before and after performing an RTA process thereon.

The 2D WSe$_2$ nanostructures of Examples 1 and 2 and Comparative Example 1 were subjected to the XPS after the treatment of the RTA process, and the results are shown in FIGS. 8A to 8C.

As shown in FIG. 8C, in the XPS spectrum for the 2D WSe2 nanostructure of Comparative Example 1, a peak corresponding to Se 3d orbital was observed at a binding energy in a range of about 54 eV to about 56 eV, and furthermore, an additional peak corresponding to the Se—C bond was observed at a binding energy in a range of about 56 eV to about 58 eV However, as shown in FIGS. 8A and 8B, in the XPS spectrum for the 2D WSe2 nanostructures of Examples 1 and 2, only a peak corresponding to Se 3d orbital was observed at a binding energy in a range of about 54 eV to about 56 eV, whereas a peak corresponding to the Se—C bond was insignificant.

Therefore, as shown in FIGS. 8A to 8C, in the XPS spectrum for the 2D WSe2 nanostructure of Examples 1 and 2, a ratio (I2/I1) of a peak intensity of the chalcogen-carbon bond (I2) having a binding energy in a range of about 56 eV to about 58 eV to a peak intensity (I1) of the chalcogen element having a binding energy in a range of about 54 eV to about 56 eV was less than or equal to 0.1, whereas a ratio (I2/I1) of peaks measured in the 2D WSe2 nanostructure of Comparative Example 1 was 0.3 or more.

As described above, a structure of a 2D nanostructure may be easily controlled by controlling a structure of a chalcogenide precursor.

It should be understood that example embodiments described herein should be considered in a descriptive sense only and not for purposes of limitation. Descriptions of features within each example embodiment should typically be considered as available for other similar features in other embodiments.

While one or more example embodiments have been described with reference to the figures, it will be understood by those of ordinary skill in the art that various changes in form and details may be made therein without departing from the spirit and scope as defined by the following claims.

What is claimed is:

1. A method of preparing a two-dimensional (2D) transition metal chalcogenide nanostructure, the method comprising:

preparing a 2D transition metal chalcogenide nanostructure by a reaction between a transition metal precursor and a chalcogen precursor in a composition comprising a solvent, wherein the chalcogen precursor is a compound including a first bond connecting two neighboring chalcogen elements and a second bond connecting one of the two neighboring chalcogen element and a hetero-element adjacent thereto, a binding energy of the second bond is about 110% or less of a binding energy of the first bond, wherein the 2D transition metal chalcogenide nanostructure has single crystallinity and was made in solution.

2. The method of claim 1, wherein the chalcogen precursor comprises a compound represented by Formula 1:

R1-A1-A2-R2,   <Formula 1> wherein, in Formula 1,

A1 and A2 are each independently a chalcogen element,

R1 and R2 are each independently be a C1-C5 alkyl group substituted or unsubstituted with a halogen, a C2-C10 alkenyl group substituted or unsubstituted with a halogen, a C2-C10 alkynyl group substituted or unsubstituted with a halogen, a C5-C10 cycloalkyl group substituted or unsubstituted with a halogen, a C7-C20 alkylaryl group substituted or unsubstituted with a halogen, a C3-C20 alkylheteroaryl group substituted or unsubstituted with a halogen, or a trialkylsilyl group substituted or unsubstituted with a halogen, wherein one or more alkyl group(s) of the trialkylsilyl group are each independently a C1-C5 alkyl group, and a bond A1-A2 is a first bond, and a bond A1-R1 or a bond A2-R2 is a second bond.

3. The method of claim 1, wherein the solvent comprises at least one of oleyamine, trioctylphosphine oxide (TOPO), tetradecylphosphonic acid (TDPA), oleyl acid, oleyl alcohol, octadecene, trioctylphosphine (TOP), and dodecylamine.

4. The method of claim 1, wherein the reaction between the transition metal precursor and the chalcogen precursor is performed at a temperature in a range of about 250° C. to about 400° C. for about 10 to about 30 hours.

5. The method of claim 1, wherein the reaction between the transition metal precursor and the chalcogen precursor is initiated by radicals produced by decomposition of the second bond in the chalcogen precursor.

* * * * *